United States Patent
Ebsen et al.

(10) Patent No.: US 9,058,870 B2
(45) Date of Patent: Jun. 16, 2015

(54) HASH FUNCTIONS USED TO TRACK VARIANCE PARAMETERS OF RESISTANCE-BASED MEMORY ELEMENTS

(71) Applicant: Seagate Technology LLC, Cupertino, CA (US)

(72) Inventors: David Scott Ebsen, Minnetonka, MN (US); Antoine Khoueir, Apple Valley, MN (US); Mark Allen Gaertner, Vadnais Heights, MN (US)

(73) Assignee: Seagate Technology LLC, Cupertino, CA (US)

( * ) Notice: Subject to any disclaimer, the term of this patent is extended or adjusted under 35 U.S.C. 154(b) by 325 days.

(21) Appl. No.: 13/762,979

(22) Filed: Feb. 8, 2013

(65) Prior Publication Data

US 2014/0226389 A1  Aug. 14, 2014

(51) Int. Cl.
*G06F 12/00* (2006.01)
*G11C 13/00* (2006.01)
*G06F 17/30* (2006.01)

(52) U.S. Cl.
CPC ...... *G11C 13/0002* (2013.01); *G06F 17/30949* (2013.01)

(58) Field of Classification Search
None
See application file for complete search history.

(56) References Cited

U.S. PATENT DOCUMENTS

| | | | |
|---|---|---|---|
| 2009/0031082 A1* | 1/2009 | Ford et al. | 711/128 |
| 2012/0102298 A1* | 4/2012 | Sengupta et al. | 711/216 |
| 2012/0110278 A1 | 5/2012 | Davis et al. | |
| 2012/0233381 A1 | 9/2012 | Anderson et al. | |
| 2013/0311837 A1* | 11/2013 | Bedeschi | 714/49 |

* cited by examiner

*Primary Examiner* — Baboucarr Faal
(74) *Attorney, Agent, or Firm* — Hollingsworth Davis, LLC

(57) ABSTRACT

Parameters indicative of resistance variance of the memory elements are tracked. The resistance variance affects values of data stored in the resistance-based memory elements. A hash function is performed for each memory element. The hash function returns a reference to one of a plurality of counter elements. A value of each counter element is modified in response to the tracked parameter data of the associated memory element. Read operations affecting the memory elements are adjusted based on the values for the associated counter elements.

20 Claims, 6 Drawing Sheets

HASH FUNCTIONS USED TO TRACK VARIANCE PARAMETERS OF RESISTANCE-BASED MEMORY ELEMENTS

SUMMARY

The present disclosure is related to using hash functions to track variance parameters of resistance-based memory elements. In one example, an apparatus includes a controller coupled to a plurality of resistance-based memory elements. The controller is configured to track parameters indicative of resistance variance of the memory elements. The resistance variance affect values of data stored in the memory elements. The controller performs a hash function for each memory element. The hash function returns a reference to one of a plurality of counter elements. The controller modifies a value of each counter element in response to the tracked parameter data of the associated memory element, and adjusts read operations affecting the memory elements based on the values for the associated counter elements.

In another embodiment, an apparatus and method facilitates performing two or more hash functions on a key associated with a resistance-based memory element in response to an event affecting the memory element. The hash functions return references to two or more respective counter elements. A value of the respective counter elements is modified in response to the event. In response to a read operation targeted to the memory location, a resistance variance parameter of the memory is determined from the respective counter elements. An error rate of the read operation is reduced using the resistance variance parameter.

These and other features and aspects of various embodiments may be understood in view of the following detailed discussion and accompanying drawings.

BRIEF DESCRIPTION OF THE DRAWINGS

In the following diagrams, the same reference numbers may be used to identify similar/same components in multiple figures.

DETAILED DESCRIPTION

In the following description of various example embodiments, reference is made to the accompanying drawings that form a part hereof, and in which is shown by way of illustration various example embodiments. It is to be understood that other embodiments may be utilized, as structural and operational changes may be made without departing from the scope of the claims appended hereto.

The present disclosure is generally related to persistent data storage devices, such as those using resistance-based memory. Generally, resistance based memories include memory cells whose internal resistance can persistently altered by the application of a signal. Examples of resistive memory elements include phase-change memory (PCM) and resistive random-access memory (RRAM or ReRAM). Phase-change memory utilizes a chalcogenide glass that can be changed from an amorphous state to a crystalline state via application of current. These two states (and intermediate states which may include both amorphous and crystalline regions) have different resistances. Resistive random-access memory utilizes a dielectric that can exhibit a persistent change in resistance in response to the application of a sufficiently high voltage.

In both PCM and RRAM, the resistance level of memory cells can shift over time. These shifts can be caused by use (e.g., reading from and writing to the cells or adjacent cells) and/or through conditions (e.g., temperature, vibration) that cause physical changes to the cells over the passage of time. Shifts in memory cell resistance can cause an increase in bit error rates when stored data is read back. Cells that store more than one bit of data (e.g., those that distinguish between more than one resistance threshold) may experience relatively larger increases in bit error rates over time than single bit cells. As a result, it is desirable to track data that may provide indicators of resistance shift. Such data can be used to compensate for predicted resistance shifts are reduce bit error rates.

Figure 1:
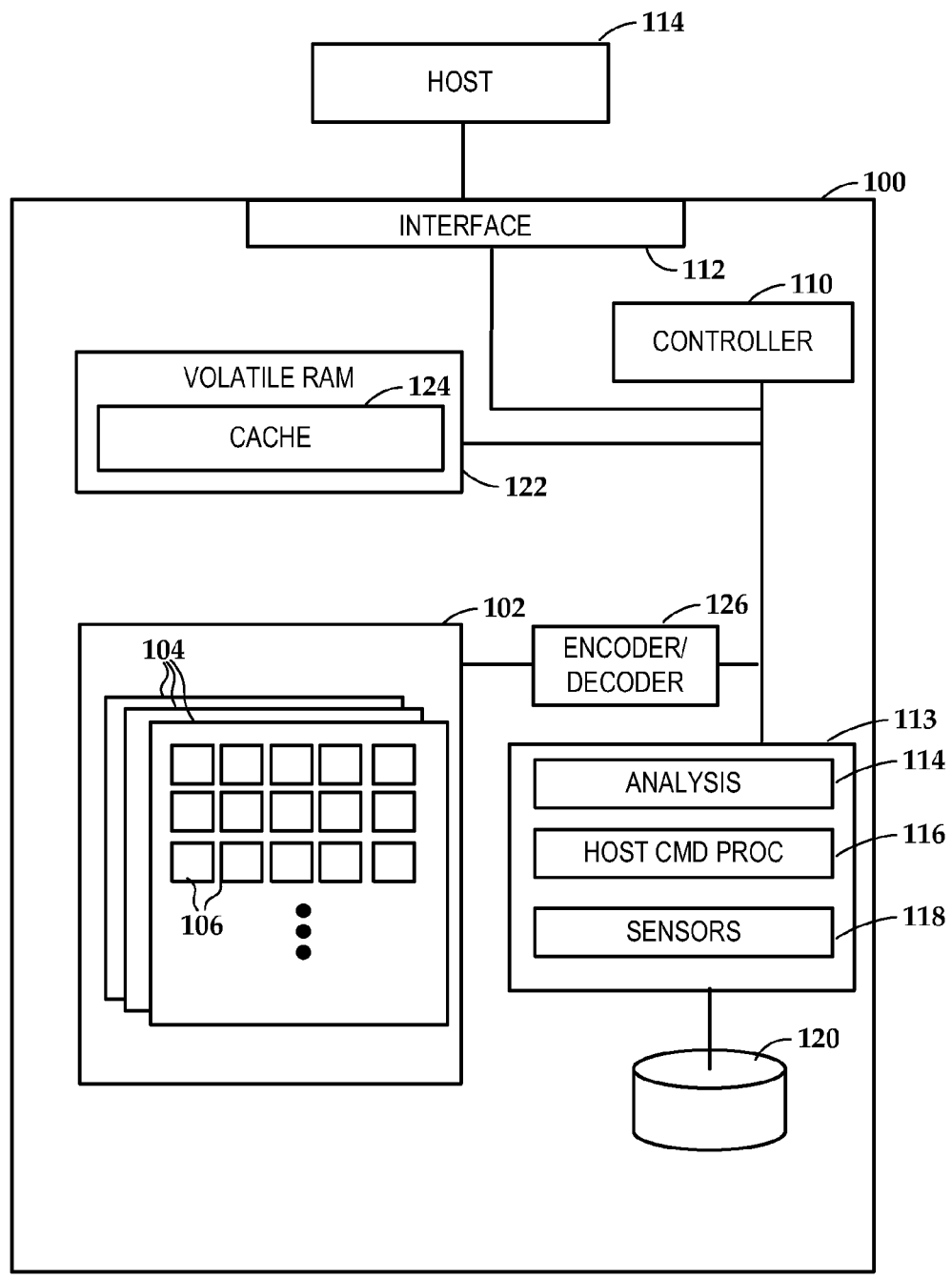
FIG. 1 is a block diagram of an apparatus according to an example embodiment.

In FIG. 1, a block diagram illustrates a memory storage device 100 according to an example embodiment. This device 100 may be configured as a solid-state drive (SSD) (or subcomponent thereof) that utilizes resistive memory in place of or in addition to other types of solid state memory, such as flash memory. The features of the device 100 may be applicable to other types of hard drive devices, such as hybrid drives that use a combination of solid-state memory types and/or magnetic disks. The features of the device 100 may also be applicable to other types of memory devices, such as special purpose data storage devices (or sub-components thereof) that do not utilize standardized hard drive data interfaces.

The device 100 includes a memory unit 102 that contains some or all of the non-volatile memory of the device 100. The memory unit 102 may include one or more discrete physical units 104, e.g., memory chips. Within each of the physical units 104, the memory may be grouped into smaller blocks. For purposes of the present discussion, the smallest host-addressable unit of memory is referred to as a page 106. A page 106 generally includes a plurality of memory cells that are written to and read from together by a host 114 communicating via a host interface. For example, if each memory cell can store two bits of data and each page 106 stores 512 bytes (4096 bits) of data, then 2048 memory cells are used for each page. In such a case, each megabyte of memory would include 2048 individually addressable pages.

The page addressing scheme describe above may be used by the host 114 for purposes of efficiency. For example, if the host uses a 32-bit logical address to access individual pages, the host can use around $4.3 \times 10^9$ individual addresses. If the logical addresses were mapped to individual bytes, this would limit the drive to a maximum capacity of 4 GB. Using 512 byte pages sizes allows a 32-bit address to access up to 2 TB of data. The amount of addressable memory can be increased further by using longer size address words (e.g., 64-bit), larger page sizes, etc.

While the host interface 112 may provide page-level access the memory 102, the internal components, e.g., controller 110, of the storage device 100 may have finer granularity access. For example, resistive memories may allow individual cells to be addressed, providing the possibility that each bit or set of bits stored in the cell may be independently written to and/or read from. In many implementations, the internal architecture may be configured to perform read/write operations on multiple memory cells at a time, e.g., writing to and reading from words of one or more bytes in a single operation. Nonetheless, the internal addressing may be of much finer granularity than what is made available via the host interface.

The device 100 may include functional units configured to measure metrics related to workload of the memory unit 104. These metrics can be tracked to predict resistance shifts of resistance-based memory cells. Generally, for a given data value stored in a cell, the resistance of the cell should be within a predetermined range in order for the data to be reliably read back at a later time. Factors such as temperature, neighboring cell activity, elapsed time since data was programmed, etc., may result in the resistance of the cell shifting outside this range, which may lead to bit errors when reading the data. Although these bit errors may be correctable through the use of error correction codes (ECC), it is generally desirable to keep bit error rates as low as possible.

The device 100 includes a processor 113 that may include any combination of hardware, firmware, and/or software modules. For example, an analysis module 114 tracks reliability metrics. The metrics may be obtained by way of one or more host command processors 116 that perform read/write operations in response to host request. Metrics may also be obtained from sensors 118 of the device (e.g., temperature sensor). As will be described in greater detail below, the metrics are stored in a reduced form, e.g., in a local non-volatile database 120 and/or in a volatile memory 122, e.g., in a non-volatile cache 124 that mirrors the non-volatile database 120 yet facilitates faster updating of metrics. The metrics can be used by an encoder/decoder 126 (and/or related circuitry, such as a channel processor) for adjusting parameters used for reading from and writing to memory 102.

Resistance shifts in memory cells may correlate to any combination of metrics, such as an elapsed time since the cell was last programmed, number of program cycles, temperature, vibration, ambient condition, write effort, voltage spikes, etc. As a result, tracking these metrics may be useful in predicting shifts in the measured resistance of cells over time. These predictions can be useful when reading back the data from the cells, and may also be used in ECC algorithms. Some of these factors may be of interest both in regards to a target cell, but also to neighboring cells. For example, intensive read/programming activity at a group of target cells may cause above-average disturb in neighboring cells.

It would be desirable to track this activity on a per-page basis. However, this granularity of tracking may generate large amounts of data, such that it may not be practical to store the generated data during regular device operation. In order to reduce storage requirements, devices and methods described herein utilize hash functions to track memory activity that may affect resistance shifts. The hash functions may be keyed by, among other things, the addressing scheme of the memory, and used to update hash table counters. The hash functions can be used to map the large data set created by the tracking of multiple metrics into smaller sets. By employing hash tables keyed to the address (axis of disturbances), a minimal amount of counters (metadata) can provide high probability of detection. This reduces the amount of metadata needed to track the activity over a very large number of addresses.

Figure 2:
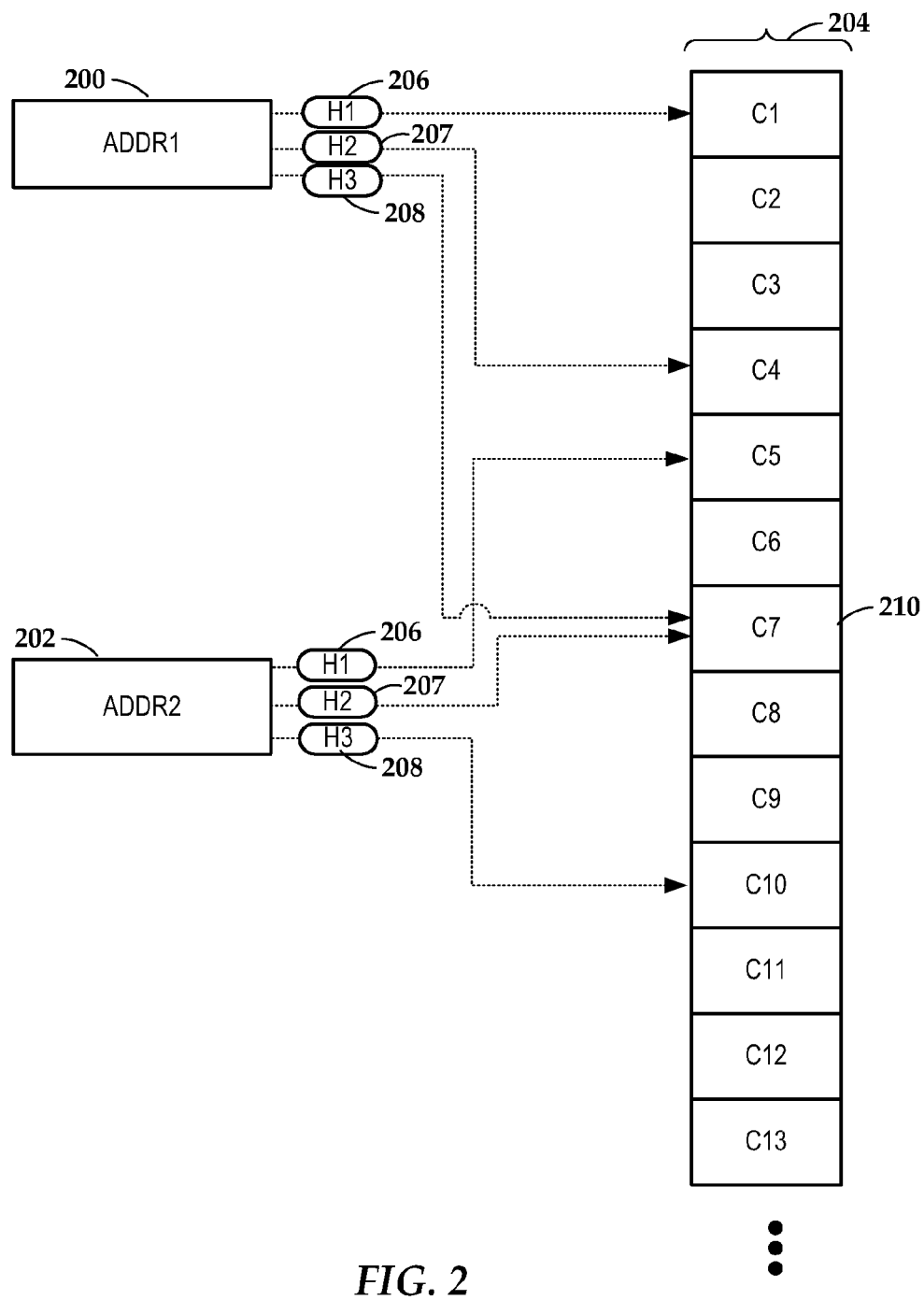
FIG. 2 is a block diagram illustrating the use of hash functions to track metrics according to an example embodiment.

In FIG. 2, a block diagram illustrates the use of hash functions to track activity metrics according to an example embodiment. The metrics are related to individual addressable elements, indicated here by memory locations 200 and 202. Generally, there may be several millions of memory elements each associated with an address, such as a physical address associated with a region (e.g., byte, word, page) in memory. The addresses of memory locations 200 and 202 are represented in the figure as ADDR1 and ADDR2.

A tracking component (not shown) tracks metrics associated with the memory locations 200, 202. The metrics may include events/parameters such as read/write cycles, detected errors, elapsed time since last read/write, temperature, write effort, etc. A set of counters 204 are used as storage elements for tracking the data. The counters 200 may at least include a variable (e.g., n-bit integer) that can be increased or decreased. Other metadata (e.g., pointers to memory locations of the counters) may be stored as part of the counter data structure, e.g., a pointer table used to access individual counters.

Each time a tracked event occurs to a particular resistance-based memory location, a plurality of hash functions are performed on a key particular to the memory location. For example, a physical address of the memory location may be used as a key. In another example, the memory may be addressed by word and bit line. The word and bit line values may be combined into a single binary number, and used as a key for multiple hash functions. Other data, such as unique chip identifiers, may also be combined with other data to form a key.

Generally, a hash function takes an input value (a key) and produces an output value to which the key maps. In one application, the output can be used to create a hash table, which includes a storage element associated with each output value of the hash function. A general example of a hash table is a dictionary that stores individual English words, and an appropriate hash function might be one that returns the first letter of the word. A hash table in such an example would have 26 storage elements (e.g., arrays, linked lists, trees) each associated with a letter in the English alphabet. Each word would be placed in a storage element associated with its first letter. This can speed lookups for words beginning with a particular letter, as only a portion of the total hash table would need to be searched for the word.

In the present example, the storage elements is a hash table with a set of counters 204 that track a metric associated with the resistance-based memory locations. In order to reduce the amount of storage space needed to track the metrics, the number of counters 204 is significantly less than the number of storage locations. Over a given time period, only a small percentage of the total storage space may see activity. Therefore, depending on how the hash function and counters are selected, a risk of collision can be minimized. A collision generally refers to a situation where two different keys map to the same hash table entry.

To further mitigate the effects of collisions, multiple hash functions may be used to map the tracked metrics. This is indicated in FIG. 2, with three hash functions 206-208 that are each applied to an event affecting memory locations 200 and 202. The hash functions 206-208 are chosen so that the resulting counter selected from each of the functions 206-208 will be different for the same key. The dashed lines between memory locations 200 and 202 and individual counters 204 indicate the outcome of the hash functions. It will be appreciated that the selection of three hash functions for this example is arbitrary, and in practice any number of hash functions may be used.

A collision can be seen in FIG. 2 at counter 210, where H3(ADDR1)=C7 and H1(ADDR2)=C7. To mitigate the effects of the collision, the values of the three counters associated with each memory location may be statistically compared or combined to obtain the metric of interest. For example, an average, median, and/or mode, etc. of the counter values may be used to determine the metric of interest from multiple hash table entries. The metric of interest can be used approximate the resistance shift in the cells of interest.

Figure 3:
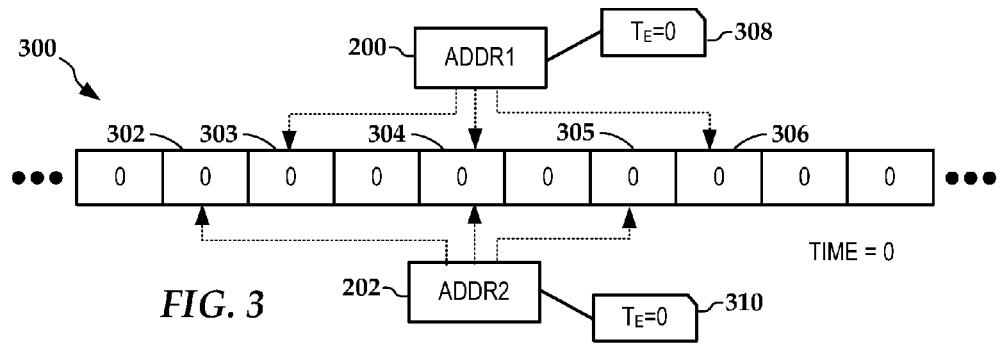
FIGS. 3-5 are block diagrams illustrating a hash table used to track elapsed time since last read/write according to an example embodiment.
Figure 4:
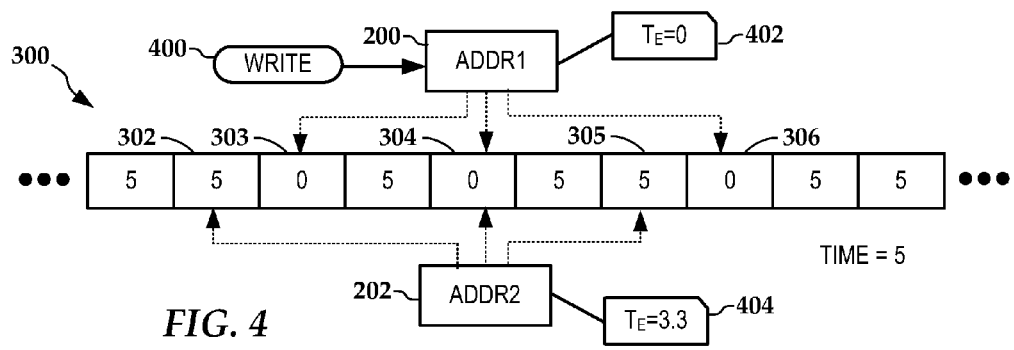
Figure 5:
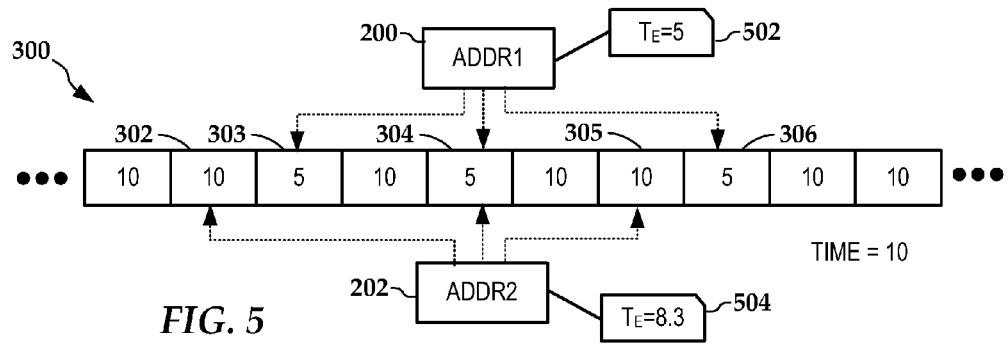

An example of how a hash table may be used to track elapsed time ($T_E$) since last read/write is shown in FIGS. 3-5. This metric is tracked for memory locations 200, 202 as previously described using a hash table 300. Counters 302-306 of the hash table 300 are associated with the memory locations 200, 202 as indicated by the dashed lines. Counter 304 is associated with both memory locations 200, 202, which results in a collision in tracked metrics between the two elements.

In FIG. 3, the hash table 300 is shown initialized at time=0, where all counters of the table 300 are set to zero. In this example, the system will repeatedly trigger an event to increment all the counters of the hash table 300, thereby increasing the amount of elapsed time since last read/write activity. As indicated by data values 308, 310, a lookup of elapsed time for respective memory locations 200, 202 will yield $T_E$=0.

In FIG. 4, time has been incremented by five units, and addressable element 200 has been written to as indicated by write function 400. The write function 400 will reset counters 303, 304, 306 associated with element 200. As indicated by data values 402, 404, a lookup of elapsed time for memory location 200 will yield $T_E$=0, but for memory location 202, the lookup will yield $T_E$=3.3, assuming an average of counters 302, 304, and 305 is used. If the mode or median of the counters is instead used, then elapsed time is $T_E$=5 for memory location 202.

In FIG. 5, time has been incremented by five units from the state shown in FIG. 4, which is ten time units from the state shown in FIG. 3. As indicated by data values 502, 504 a lookup of elapsed time for memory location 200 will yield $T_E$=5, but for memory location 202 will yield $T_E$=8.3, assuming an average of counters 302, 304, and 305 is used. If the mode or median of the counters is instead used, then elapsed time is $T_E$=10 for memory location 202.

Figure 6:
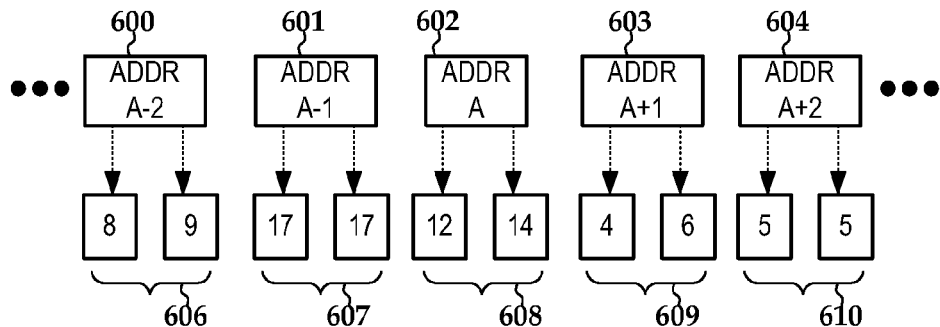
FIGS. 6 and 7 are block diagrams illustrating how metrics of neighboring memory cells may be updated according to an example embodiment.
Figure 7:
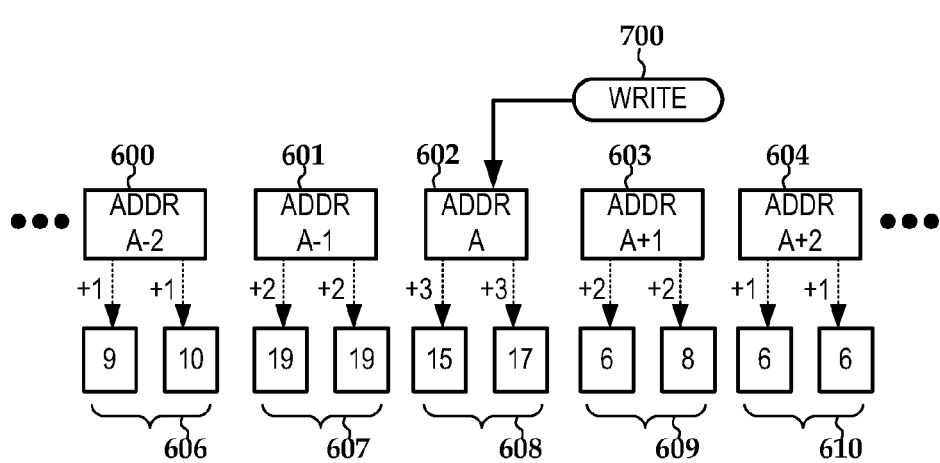

As shown above, any metrics described herein may be incremented, decremented, or otherwise changed in response to an event that affects a memory location. The events may also cause changes to metrics of physically neighboring memory locations. Due to the close proximity of memory cells, activities in one cell may affect the readout value of an adjacent cell through such phenomena as thermal coupling, stray currents, capacitive coupling, etc. As a result, an event affecting one cell may be tracked in a neighboring cell, and vice versa. In FIGS. 6 and 7, block diagrams illustrate how metrics of neighboring memory cells may be updated according to an example embodiment.

In FIG. 6, a plurality of memory locations 600-604 are physically proximate to each other as shown in the figure, e.g., memory location 600 is at least proximate to memory location 601, memory location 601 is at least proximate to memory locations 600 and 602, etc. For each of the memory locations 600-604, counter sets 606-610 respectively track a number of write accesses affecting the locations. For purposes of clarity, two counters are shown in each set 606-610, although in practice more than two counters may be used. The individual counters within some of the counter sets 606-610 sets may have different values to hash table collisions. In this example, the proximity of the memory locations 600-604 is indicated by proximity of address values. However, there need not be a correlation between address proximity and physical proximity so long as the physical proximity of memory locations 600-604 can be determined.

In FIG. 7, a write event 700 is directed to memory location 602. In response to this event 700, the counters 608 are incremented by some value, in this case by three. The counters of immediately adjacent memory locations 601, 603 are incremented by two, and the counters of memory locations 600, 604 are incremented by one. These values indicate a relatively decreasing disturb effect in proportion to distance from the affected memory location 602, and alternate update schemes may be applied. For example, the value of counter updates may be non-linear with respect to distance from the affected location 602.

The probability of getting a false indication is exponentially decreased by the number of hash functions for each affected memory location. Multiple hash tables could also be used. Each hash table will have a finite number of elements which will be shared across the address space of the memory being tracked. The hash functions could use unique prime number moduli such that inter-address interference would be limited. The hash table counters can be adjusted by degradation functions to account for shifts over time. For example, counters can be incremented or decremented by the passage of time as previously indicated in FIGS. 3-5.

Figure 8:
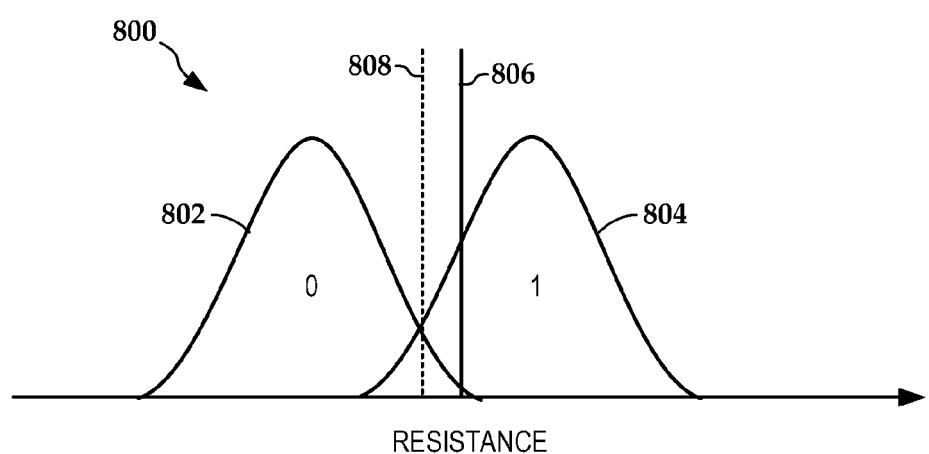

In reference now to FIG. 8, a graph 800 illustrates an example of how a resistance shift may be compensated for using metrics gathered as described herein. Curves 802, 804 illustrate distributions of resistances measured in a two-level cell for respective zero and one values. Line 806 represents a nominal threshold resistance value that may be used by a hard detector to determine the programmed value of the cell. Over time, the distributions 802, 804 have shifted to the left, such that a programmed value of 1 may have a higher probability of being read as a 0 than the probability of the reverse occurring. As such, using an adjusted threshold 808 will minimize these errors. The direction and magnitude of the adjustment may be determined based on the metrics gathered as described above. A similar shift may be used for a soft decoder, e.g., adjusting log-likelihood ratio (LLR) of estimated values.

Figure 9:
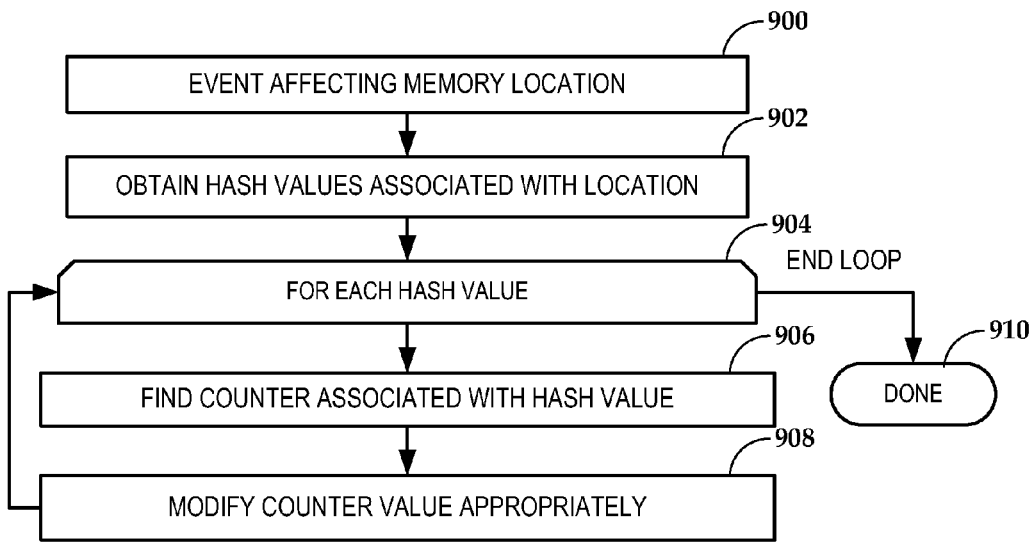
FIGS. 9-12 are flowcharts of methods according to example embodiments.

In reference now to FIG. 9, a flowchart illustrates a method that facilitates gathering metrics according to an example embodiment. In response to an event 900 that affects a memory location, a set of hash values associated with the location is obtained 902. A loop 904 iterates through each hash value, finding 906 a counter associated with the hash value and modifying 908 the counter appropriately. Upon completion of the loop 904, the procedure is complete 910.

Figure 10:
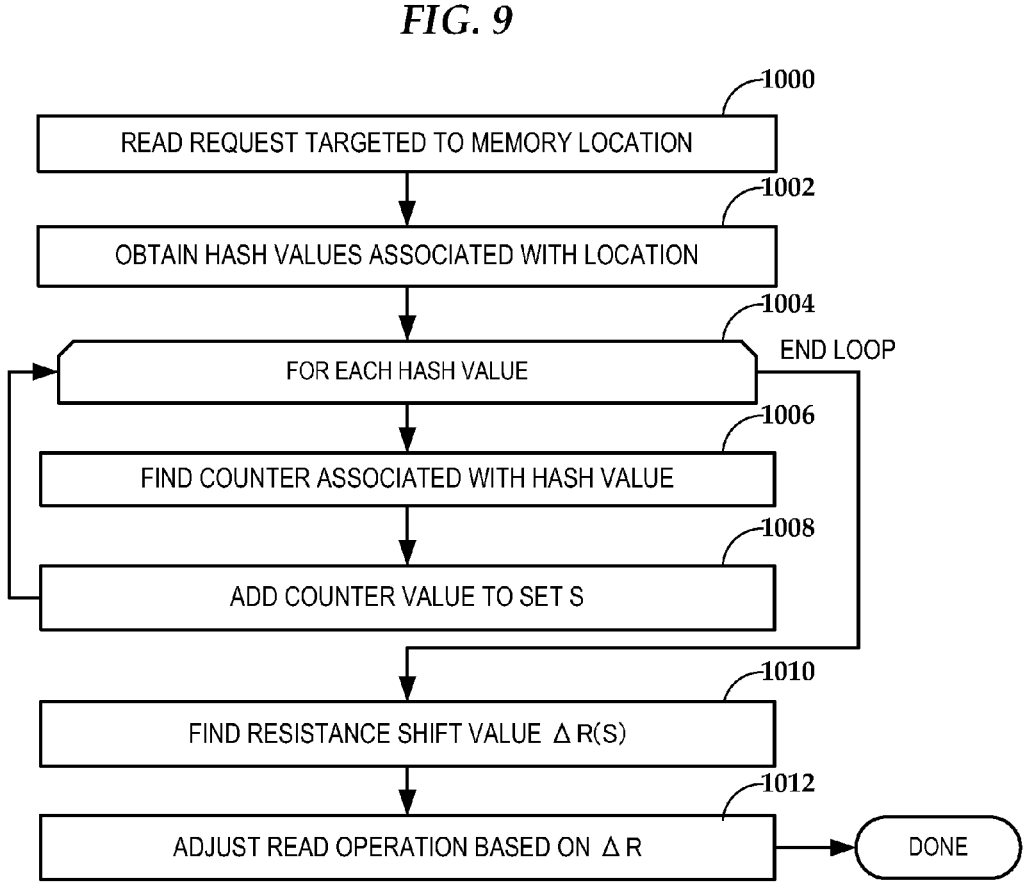

In reference now to FIG. 10, a flowchart illustrates a method that facilitates applying metrics according to an example embodiment. In response to a read request 1000 targeted to a memory location, a set of hash values associated with the location is obtained 1002. A loop 1004 iterates through each hash value, finding 1006 a counter associated with the hash value and adding 1008 the counter value to a set S. Upon completion of the loop 1004, a resistance value is found 1010 based on the set S. This may involve statistically analyzing the set (e.g., average, median) and applying a scaling operation to determine a resistance shift $\Delta R$. The resistance shift is used to adjust 1012 a read operation.

Figure 11:
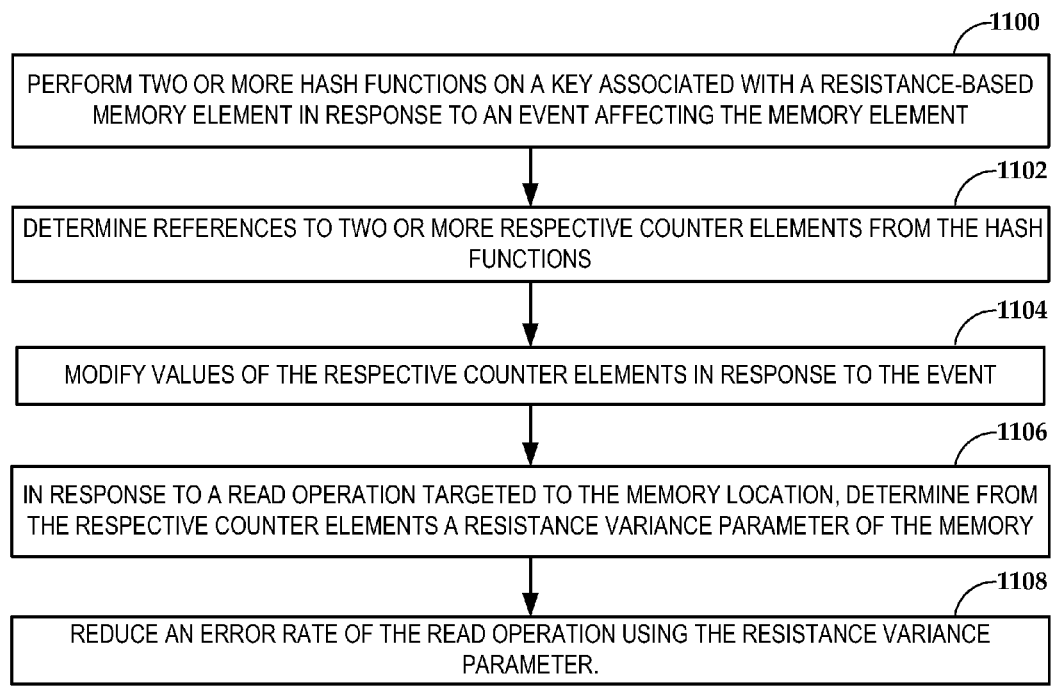

In reference now to FIG. 11, a flowchart illustrates a method according to another example embodiment. In response to an event affecting a memory location of a resistance-based memory element, two or more hash functions are performed 1100 on key associated with the memory location. Two or more respective counter elements are determined 1102 from the hash functions, and values of the counters are modified 1104 in response to the event. In response to a read operation targeted to the memory location, a resistance variance parameter of the memory is determined 1106 from the respective counter elements. An error rate of the read operation is reduced 1108 using the resistance variance parameter.

Figure 12:
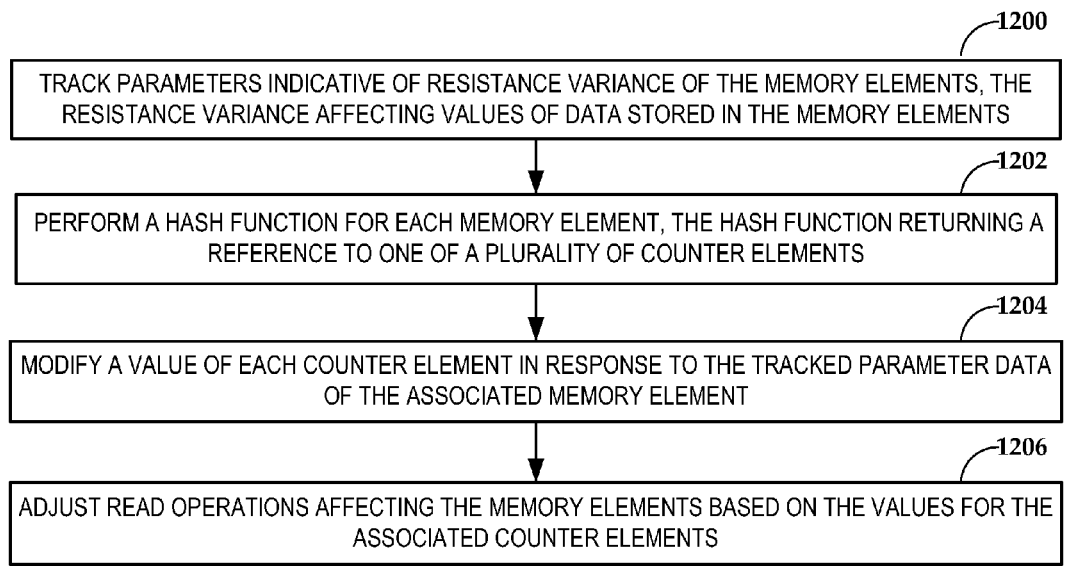

In reference now to FIG. 12, a flowchart illustrates a method according to another example embodiment. The method involves tracking 1200 parameters indicative of resistance variance of the memory elements, the resistance variance affecting values of data stored in the memory elements. A hash function for each memory element is performed 1202, the hash function returning a reference to one of a plurality of counter elements. A value of each counter element is modified 1204 in response to the tracked parameter data of the associated memory element, and read operations affecting the memory elements are adjusted 1206 based on the values for the associated counter elements The various embodiments described above may be implemented using circuitry and/or software modules that interact to provide particular results. One of skill in the computing arts can readily implement such described functionality, either at a modular level or as a whole, using knowledge generally known in the art. For example, the flowcharts illustrated herein may be used to create logic circuits or computer-readable instructions/code for execution by a processor. Such instructions may be stored on a computer-readable medium and transferred to the processor for execution as is known in the art. The structures and procedures shown above are only a representative example of embodiments that can be used to facilitate managing caching in data storage devices as described above.

The foregoing description of the example embodiments has been presented for the purposes of illustration and description. It is not intended to be exhaustive or to limit the inventive concepts to the precise form disclosed. Many modifications and variations are possible in light of the above teaching. Any or all features of the disclosed embodiments can be applied individually or in any combination are not meant to be limiting, but purely illustrative. It is intended that the scope be limited not with this detailed description, but rather determined by the claims appended hereto.

What is claimed is:

1. An apparatus comprising:
 a controller coupled to a plurality of resistance-based memory elements, the controller configured to perform:
  tracking parameter data indicative of resistance variance of the memory elements, the resistance variance affecting values of data stored in the memory elements;
  performing a hash function for each memory element, the hash function returning a reference to one of a plurality of counter elements;
  modifying a value of each counter element in response to the tracked parameter data of the associated memory element; and
  adjusting read operations affecting the memory elements based on the values for the associated counter elements.

2. The apparatus of claim 1, wherein the memory elements comprise one or more of phase change memory elements and resistive random access memory elements.

3. The apparatus of claim 1, wherein the parameter data comprises one or more of retention time, number of data access cycles, neighboring data values, neighboring memory cell activity, temperature, and write effort.

4. The apparatus of claim 1, wherein addresses of the memory elements are used as keys for the hash function.

5. The apparatus of claim 1, wherein adjusting the read operations affecting the memory elements comprises adjusting a read threshold level of the memory elements.

6. The apparatus of claim 1, wherein the controller is further configured to modify the value of each counter element based on the passage of time.

7. An apparatus comprising:
 a controller coupled to a plurality of resistance-based memory elements memory locations, the controller configured to perform:
  in response to an event affecting a memory location of at least one of the memory elements, performing two or more hash functions on key associated with the memory location, the hash functions returning references to two or more respective counter elements;
  modifying a value of the respective counter elements in response to the event;
  in response to a read operation targeted to the memory location, determining from the respective counter elements a resistance variance parameter of the memory; and
  reducing an error rate of the read operation using the resistance variance parameter.

8. The apparatus of claim 7, wherein the memory elements comprise one or more of phase change memory elements and resistive random access memory elements.

9. The apparatus of claim 7, wherein the event is indicative of one or more of retention time, number of data access cycles, neighboring data values, neighboring memory cell activity, temperature, and write effort.

10. The apparatus of claim 7, wherein determining from the respective counter elements the resistance variance parameter comprises performing a statistical analysis of the respective counter elements.

11. The apparatus of claim 7, wherein adjusting the read operations affecting the memory elements comprises adjusting a read threshold level of the memory elements.

12. The apparatus of claim 7, wherein the event comprises a passage of time.

13. The apparatus of claim 7, wherein the event comprises a host data access request targeted to the memory location.

14. A method comprising:
 performing two or more hash functions on a key associated with a resistance-based memory element in response to an event affecting the memory element, the hash functions returning references to two or more respective counter elements;
 modifying a value of the respective counter elements in response to the event;
 in response to a read operation targeted to the memory location, determining from the respective counter elements a resistance variance parameter of the memory; and
 reducing an error rate of the read operation using the resistance variance parameter.

15. The method of claim 14, wherein the memory elements comprise one or more of phase change memory elements and resistive random access memory elements.

16. The method of claim 14, wherein the event is indicative of one or more of retention time, number of data access cycles, neighboring data values, neighboring memory cell activity, temperature, and write effort.

17. The method of claim 14, wherein determining from the respective counter elements the resistance variance parameter comprises performing a statistical analysis of the respective counter elements.

18. The method of claim 14, wherein adjusting the read operations affecting the memory elements comprises adjusting a read threshold level of the memory elements.

19. The method of claim 14, wherein the event comprises a passage of time.

20. The method of claim 14, wherein the event comprises a host data access request targeted to the memory location.

* * * * *